United States Patent [19]

Hsia et al.

[11] Patent Number: 4,932,883

[45] Date of Patent: Jun. 12, 1990

[54] ELASTOMERIC CONNECTORS FOR ELECTRONIC PACKAGING AND TESTING

[75] Inventors: Liang-Choo Hsia, Mastic Beach, N.Y.; Thomas P. McAndrew, Macungie, Pa.; Fred E. Stuebner, La Grangeville, N.Y.

[73] Assignee: International Business Machines Corporation, Armonk, N.Y.

[21] Appl. No.: 384,089

[22] Filed: Jul. 20, 1989

Related U.S. Application Data

[63] Continuation of Ser. No. 167,213, Mar. 11, 1988, abandoned.

[51] Int. Cl.[5] .............................................. H01R 9/09
[52] U.S. Cl. ........................................ 439/66; 439/91
[58] Field of Search ............................. 439/66–74, 439/91; 324/158 P, 158 F; 361/412, 413, 414

[56] References Cited

U.S. PATENT DOCUMENTS

| | | | |
|---|---|---|---|
| 3,683,105 | 8/1972 | Shamash et al. | 174/68.5 |
| 3,904,934 | 9/1975 | Martin | 361/412 |
| 3,967,162 | 6/1976 | Ceresa et al. | 317/101 CM |
| 3,993,123 | 11/1976 | Chu et al. | 165/80 |
| 4,003,621 | 1/1977 | Lamp | 339/59 M |
| 4,008,300 | 2/1977 | Ponn | 264/104 |
| 4,038,599 | 7/1977 | Bove et al. | 324/158 P |
| 4,249,302 | 2/1981 | Crepeau | 439/74 |
| 4,330,165 | 5/1982 | Sado | 339/59 M |
| 4,402,562 | 9/1983 | Sado | 339/61 M |
| 4,443,756 | 4/1984 | Lightbody et al. | 324/158 F |
| 4,548,451 | 10/1985 | Benarr et al. | 339/17 M |
| 4,742,385 | 5/1988 | Kohmoto | 357/74 |

OTHER PUBLICATIONS

IBM Bulletin, Gladstein et al, vol. 22, No. 7, p. 2824, 12-1979.

Electronics, 11-27-1986, A Simple Way to Mount High-Pin-Count Modules, by Rogers Corp.

IBM Journal of Research & Development, vol. 13, No. 3, May 1969, "Reliability of Controlled Collapse Interconnections", pp. 266–270, K. C. Norris & A. H. Landzberg.

IBM Technical Disclosure Bulletin, vol. 19, No. 4, Sep. 1976, pp. 1267–1268, "Contact Probe Assembly with a Retractable Shorting Center", L. H. Faure.

*Primary Examiner*—Neil Abrams
*Attorney, Agent, or Firm*—Azia M. Ahsan

[57] ABSTRACT

An elastomeric connector for permanently or temporarily (for testing purposes) connecting area array chips without solder balls or wire bonds comprising an elastomer base material having through-hole conductors deposited therein, and surface conductor tabs which are electrically connected to the through-hole conductors deposited thereon. The surface conductor tabs have an overhanging contact region extending past the periphery of the through-hole conductors. Upon contact between the input/output pads of a chip and the overhanging contact regions of the elastomeric connector when aligned and biased towards each other, a requisite pressure causes a reactionary force by the elastomer base which facilites contact and automatic wipe. The elastomeric connectors may replace solder balls in chip connection applications, or may replace buckling beam test probe heads in chip test applications.

28 Claims, 4 Drawing Sheets

ELASTOMERIC CONNECTORS FOR ELECTRONIC PACKAGING AND TESTING

This application is a Continuation of U.S. Pat. Application Ser. No. 167,213, filed on Mar. 11, 1988, now abandoned.

BACKGROUND OF THE INVENTION

1. Field of Invention

This invention relates generally to microminiature electronic circuitry, particularly to the interconnection of integrated circuit chips in a microcircuit package for permanent interconnection or testing purposes.

2. Description of the Prior Art

In high density VLSI systems, interconnection of chips is accomplished by mounting integrated circuit chips on dielectric substrates (e.g. multilayered ceramic substrates) wherein the integrated chips are electrically interconnected by wiring means such as tabs, wire bonds or arrays of solder balls such as described in U.S. Pat. No. 3,495,133, "Controlled Collapse Chip Connections", hereafter referred to as C-4's.

Even though the C-4 approach is currently used in many VLSI systems today and is rapidly becoming more widely used throughout the industry, as it has many advantages such as the facilitation of a high number of connections in a small area and self alignment of the connections with corresponding contact pads on a substrate due to the surface tension during solder reflow, there are concerns with such systems. Primarily because of the thermal coefficient of expansion (TCE) mismatch between integrated circuit chips and the dielectric substrate that they are mounted on (e.g. ceramic), there are stress problems wherein the solder joints furthest from the center of the chip experience stresses that lead to cracking as documented in "Reliability of Controlled Collapse Interconnections" by K. C. Norris and A. H. Landzberg in the *IBM Journal of Research and Development*, 13 (3), 266 (1969). Because of this basic problem, and the trend in the industry to make larger and more fully integrated chips, the size of chips has been limited in many instances and the circuitry of larger chips is sometimes required to overhang the connecting solder ball arrays because of the limitations that the size of the solder ball arrays can be made to due to the TCE mismatch problem. For mechanical reasons, this overhang is very limited and thus chip size is still correspondingly limited. In addition, solder ball bonding of chips to substrates does not result in chips which have top surfaces which are all planar to each other. In multi-chip modules (many state of the art modules having greater than 100 chips), this causes cooling problems because the resultant non-planarity of the chips makes it difficult for internal cooling means (e.g. pistons and the like as described in U.S. Pat. 3,993,123) to contact each chip in the same manner, making the contact area between chips and internal cooling means different for each chip. For high powered chips, this presents a complex cooling problem wherein mechanically compliant mechanisms (which are relatively poor thermal conductors), must frequently be placed between the chips and internal cooling means.

Given the increasing complexity of multi-chip modules and increased integration level of integrated circuit chips, rework of modules by replacing defective chips is economically necessary. Thus, it is desirable that removal and replacement of chips be as simple as possible, preferably without requiring solder bonds or wire bonds and their associated processing steps.

To alleviate many of the problems associated with C-4 or solder ball type systems while achieving a high density of electrical connections, it is desirable to have a flexible connection between integrated circuit chips and the package that they are electrically interconnected and mechanically mounted on. In most microcircuit applications, the forces applied by the connector must be small so that the fragile chips are not unduly stressed by connector forces. Moreover, contact wipe should be automatic because surface films and debris must be penetrated to minimize contact resistance, and at such high densities, it is not possible to guarantee the wipe of each contact by external means. In addition, alignment should be relatively simple so as to approach the self alignment that exists in solder ball or C-4 type connection systems (wherein solder reflow causes self alignment of the chips).

In addition to using area arrays of contacts for permanently connecting chips to substrates, semiconductor chips are tested through the area arrays of contacts prior to connecting the chips to the substrate. It is most common that chips be tested prior to dicing, i.e. while still in wafer form. The state of the art means for carrying out comprehensive functional testing of chips while still part of an undiced wafer incorporates "buckling beam" springs as a probe to make contact with the chip input/output pads, e.g. see IBM TDB by L. H. Faure, "Contact Probe Assembly with a Retractable Shorting Center", Vol. 19, No. 4, September 1976, pp. 1267-1268.

In a typical testing apparatus and process, an undiced wafer is held in place on a chuck (e.g. a vacuum chuck), which is mounted on a high precision X-Y table. To test a chip area of the undiced wafer, the X-Y table moves the chip area under a probe (e.g. buckling beam probe) so that the chip is accurately aligned with the probe. The probe is then lowered onto the chip, while certain contact positions are monitored for initial contact. After initial contact occurs, the probe is lowered a nominal amount determined by experiment with a particular probe (e.g. 0.002 inches) to complete the temporary contact. The probes are densely populated with over 600 buckling beam spring contacts. Each buckling beam spring is essentially a flat strip with some curvature to it (e.g. see above referenced IBM TDB by Faure), and being approximately 0.25 inches long. As the buckling beam springs contact state of the art solder ball chip contacts, they deform somewhat and penetrate the solder or contact pad, to assure electrical contact.

As the amount of chip input/output, hereinafter referred to as I/O, increase, the buckling beam approach has become limited in high density, high performance applications. Electrical reasons for such limitations are that the relatively long spring length adds inductance which cannot be tolerated with today's chips having increased speed, and that mutual coupling occurs due to the dense amount of contacts in parallel. Mechanically, the state of the art in fabrication of the buckling beam springs is limited, and chip densities are increasing at a rate that buckling beam springs are at their limit in many applications, and have already been surpassed in some state of the art applications. Thus, there is also a need in the art for a dense test probe which can make temporary connections to the I/O or solder balls, (if a solder ball or C-4 system is used for permanent chip connections in a certain instance), attached to a chip, while providing low inductance, positive mechanical contact, and automatic wipe.

There have been known several types of flexible or elastomeric interconnection means in the art. For example, U.S. Pat. No. 3,683,105 teaches the use of multilayers of conductors fabricated on a dielectric film to integrate integrated circuit chips on a multilayer, multichip substrate. This patent is successful at providing an interconnection path between pads on integrated circuit chips and conductors on the top surface of an underlying substrate. However, the density is limited for chips having arrays of I/O pads such as C-4 pads because there is not a direct path between chip I/O pads beneath the chips and ceramic substrate I/O pads, but instead the path comprises metal lines which are approximately as long as the chip width running along the top and bottom of a dielectric film. These lines must pass the chip perimeter in order to connect to the next level of packaging by vias made in the underlying film. It is also not possible to have direct through connections because connection of the substrate to the dielectric film requires thermocompressive bonding after chip attachment to the film. Thus, connecting lines cannot exist under the chips, because one cannot form thermocompression bonds through the chips.

U.S. Pat. No. 4,008,300 discloses a multiconductor element for interconnecting printed circuit boards and the like. Conductive material consisting of a slurry of a conductive powder in a liquid vehicle is filled into gaps created in an elastomeric material, with the conductive material protruding above the surface of the elastomeric base material. The conductive powder conductors in this interconnection means are limited in electrical performance because their maximum conductivity is much less (i.e., approximately by a factor of 100) than corresponding solid metals such as copper or gold. Conductive powders cannot support the required current of approximately 250 mA/contact for certain power feed through locations (approximately 4 mil diameter per contact) required in VLSI applications. In present VLSI applications, approximately one third of the total number of feedthroughs are power feedthroughs. In addition, connectors used for connecting chips to substrates require that wipe between contacts be guaranteed for each connection so that accumulated films and debris between contacts are penetrated so that positive metal to metal contact occurs, and so that contact resistance is not unduly high. There is no means for automatic wipe in 4,008,300.

U.S. Pat. No. 4,003,621 discloses an electrical connector having a plurality of electrically conductive linear elements in an elastomer material. The connector is not well suited for connecting chips having a dense area array of contacts, or for testing such chips primarily because there is no allowance for wiping between aligned contacts. As stated above, it is desirable to have automatic wipe in a dense interconnection system. The failure of a single chip connection to make proper contact can be catastrophic for a system having thousands of chip interconnnections. The solid through conductors of 4,003,621 must be deformed to make proper contact. Accordingly, flexible contact wherein connectors are reuseable is not possible because deformation of entire non-flexible conductive elements is required. Since the conductive element is itself neither flexible nor resilient, use of this connector to connect chips more than once is essentially not possible.

U.S. Pat. No. 3,967,162 discloses a flexible connector wherein a flexible sheet has a plurality of paired contacts formed thereon in predetermined positions, with wiring strips electrically connecting each pair of contacts and the flexible sheet biasing the contacts into engagement. The density would be limited if used for connecting VLSI chips having area arrays of I/O pads because the conductors do not go through the elastomer body, but run along the top, bottom and sides of the flexible sheet. This long path would also present electrical concerns in high performance VLSI packages.

U.S. Pat. No. 4,330,165 discloses a means for interconnecting the contacts of two circuit boards wherein a plurality of linear conductors are embedded in an elastomer. As in the 4,003,621 reference, there are no provisions for automatic wipe, and it is not suited for dense chip to substrate connections or testing of area array chips. The metal conductors do not provide a flexible reusable connection system because they are only deformable, not flexible and resilient, even though they exist in an elastomer matrix. Use of this system requires a deformation of the metal conductors, thus use of this connector to connect chips more than once is essentially not possible.

U.S. Pat. No. 4,548,451 discloses an elastomeric connector interposer for connecting modules and printed circuit boards. The elastomeric connector disclosed therein cannot be utilized for connecting the contacts of dense area array chips to a substrate because of inherent I/O density limitations, and because of alignment problems. The state of the art area array chips that must either be connected or tested presently have I/O contacts on pitches between 8 and 12 mils, and the trend is to reduce this so that chips in the near future can be expected to have their I/O on a pitch as low as 6 mils. The subcomponents required for the '451 patent are through-vias 18 (which must have a conductor therein, and be at least approximately 4 mils in diameter to carry the current required for the power I/O locations of the chip); flexible appendages 20 which extend from flexible overlay 15 which is bonded to resilient base member 10; and the free end of appendages 20 lying above deformable protrusions 9. All of these subcomponents are required to achieve contact and wipe, and to use that connector on chips wherein a 4 mil minimum throughhole is required to carry the requisite current, then the minimum pitch possible would be in the 25 mil range which is unsuitable for the state of the art area array chips which require a denser I/O array than 25 mil spacings can provide. Alignment is critical in elastomeric chip connectors whereas it is not critical in solder ball connections which are self aligning. If used in a chip connection or test application, the contact area for alignment in the '451 patent, i.e. contact point 17, does not facilitate easy alignment primarily because of the relatively small target area which is a fundamental part of that connector because it contributes to allowing pressure contact with a minimum force, and is an interdependent subcomponent with the other portions of that connector structure.

U.S. Pat. No. 4,402,562 also discloses a means for interconnecting printed circuit boards wherein an elastic material having aniostropical electroconductivity and two insulating holder members. Electrical performance is limited because the conductors are not solid metal but an elastic-type composite of alternating insulators and conductors such as conductor filled resins.

In view of the above requirements for an elastomer connector for mounting and electrically connecting area array VLSI chips to substrates or temporarily connecting area array VLSI chips to a test probe and the existing elastomer connector art, it is evident that there is a need for an elastomeric connector which is capable of interconnecting high density VLSI chips having area array contacts. There is also a need that the elastomeric connector provide a short, direct, low inductance electrical path between corresponding contacts of the VLSI chips and substrate or test probe being connected thereto; and that flexibility be such that minimal forces are exerted upon the chips and sufficient compliance exists so that chips mounted on substrates may be planar to each other so that thermal enhancements required for dissipating heat from high powered VLSI chips will contact the chips evenly, and mechanically flexible mechanisms will be eliminated, thus reducing thermal resistance. There is a need that the connector have conductors exhibiting electrical conductivity equivalent to solid metals such as Cu, and Ag, etc. so that the connectors have low resistivity to support high currents of up to approximately 250 mA for a via of approximately 4 mils (i.e. approximately 20 mA/square mil) over long periods of time for certain power feedthrough locations. Note that the current densities for some signal feedthrough locations are an order of magnitude less than this requirement (i.e. approx. 2 mA/square mil). The connector must provide automatic wiping action and be capable of having chips attached and detached thereto by inherent mechanical means only, without requiring solder reflowing.

SUMMARY

It is a primary object of the present invention to provide a high density elastomeric connector for connecting VLSI chips having array type contacts.

It is also an object that the connector provide a short, direct, low inductance electrical path between corresponding contacts and that the connector be flexible and compliant enough so that the planarity of components mounted with the connector can be adjusted and that minimal forces are exerted on fragile integrated circuit chips.

It is a further object that the conductors of the connector have electrical conductivity equivalent to that of solid gold or copper conductors and that electrical signals run directly through the connector between corresponding electrical components.

Further objects are that the connector provide automatic wiping action between corresponding contacts of electrical components while chips may be attached and detached thereto by inherent mechanical means without requiring solder reflow.

The above objects are achieved in the novel electrical elastomeric connector of the present invention which may be used for connecting chips having an area array of input/output (I/O) contacts to substrates or for non-permanent type connections such as the temporary probe-like connections required for chip testing. The basic components include an elastomeric base material (e.g., a porous polyurethane polymer having a low compression set) such that a preselected force, which will not damage the chip (e.g., less than approximately 180 lbs/in$^2$) will cause approximately a 25–50 percent deformation of the elastomer directly underneath the point of contact with the I/O contacts of the chips. Conductors having good electrical conductivity (e.g., solid copper, gold) are lithographically deposited within and on the elastomeric base. The conductors comprise through-hole conductors which extend directly through the elastomeric base between opposite surfaces of the base, and on one surface are deposited surface conductor tabs which are electrically connected to the through-hole conductors, with an overhanging contact region extending past the periphery of each of the through-hole conductors. A direct electrical path through the elastomeric connector is established between corresponding I/O pads of the chips and corresponding substrate or test probe while accurate alignment of a dense array of I/O pads of the chips is accomplished by the I/O pads of each chip being aligned with the overhanging contact regions on one surface of the connector. Each of the corresponding I/O pads of the substrate or test probe are permanently aligned with the through-hole conductors at the surface opposite of the overhanging contact regions since the elastic base of the connectors is permanently built onto the top surface of the substrate or test probe. Once the proper alignment is made between the chip I/O and the corresponding overhanging contact regions of the surface conductor tabs, then the chips and substrates or test probes are mechanically biased toward each other. Upon contact, the elastomeric base deforms and exerts a force so that each of the overhanging contact regions contact and wipe each corresponding chip I/O. The through-hole conductors as well as the top surface conductor tabs, including the overhanging contact region of the elastomeric connectors are built within and on the elastomeric base as an integral part of the substrate which chips are mounted on or test probe. The primary embodiments of the present connector are permanent connectors between chips having area array I/O's and substrates as well as chip test probes for testing chips before they are diced and mounted on substrates.

DESCRIPTION OF THE PREFERRED EMBODIMENTS:

The elastomeric connectors of the present invention are now described in further detail with reference to the drawings which illustrate various embodiments within the scope of the invention.

Figures 1, 1A:
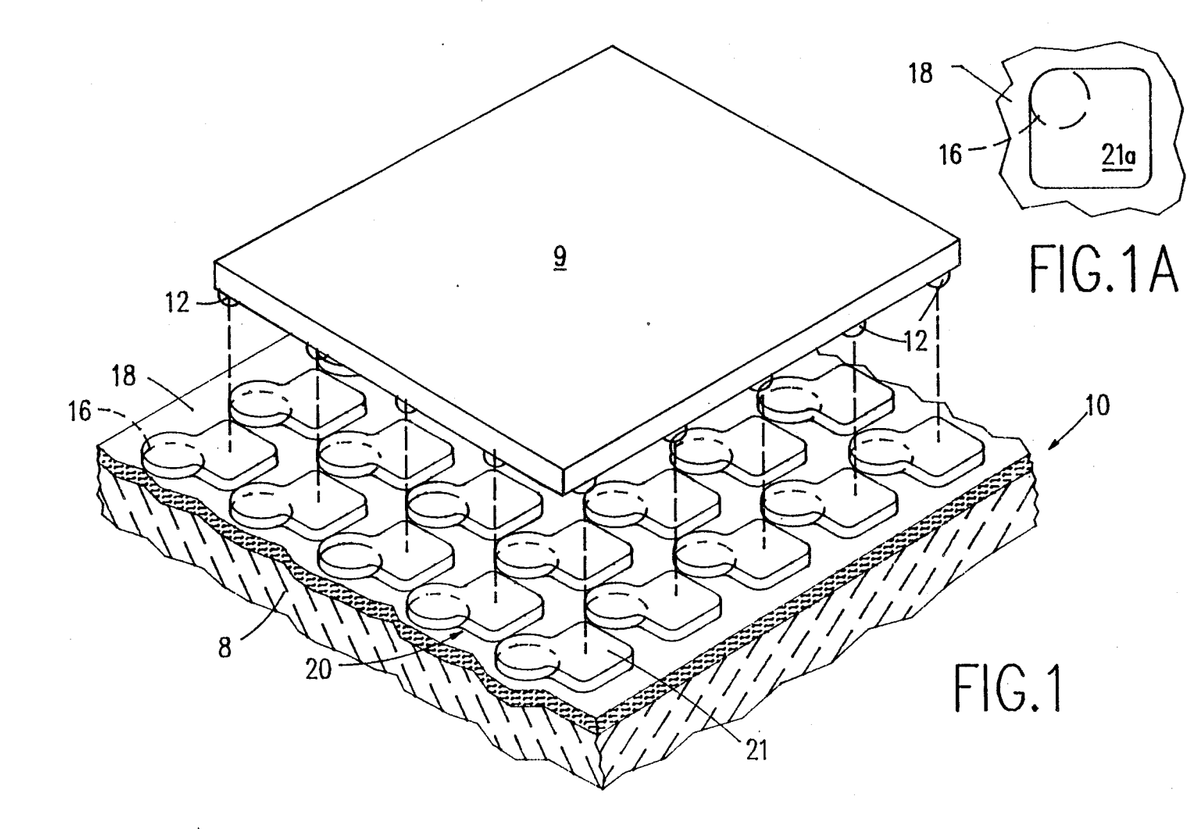
FIG. 1 is an isometric view of the elastomeric connector of the present invention in a general application of interconnecting an area array of I/O pads of two electronic packages.
FIG. 1A is a partial plan view of an alternative embodiment for the surface conductor tabs.
Figures 2, 2A, 2B, 2C:
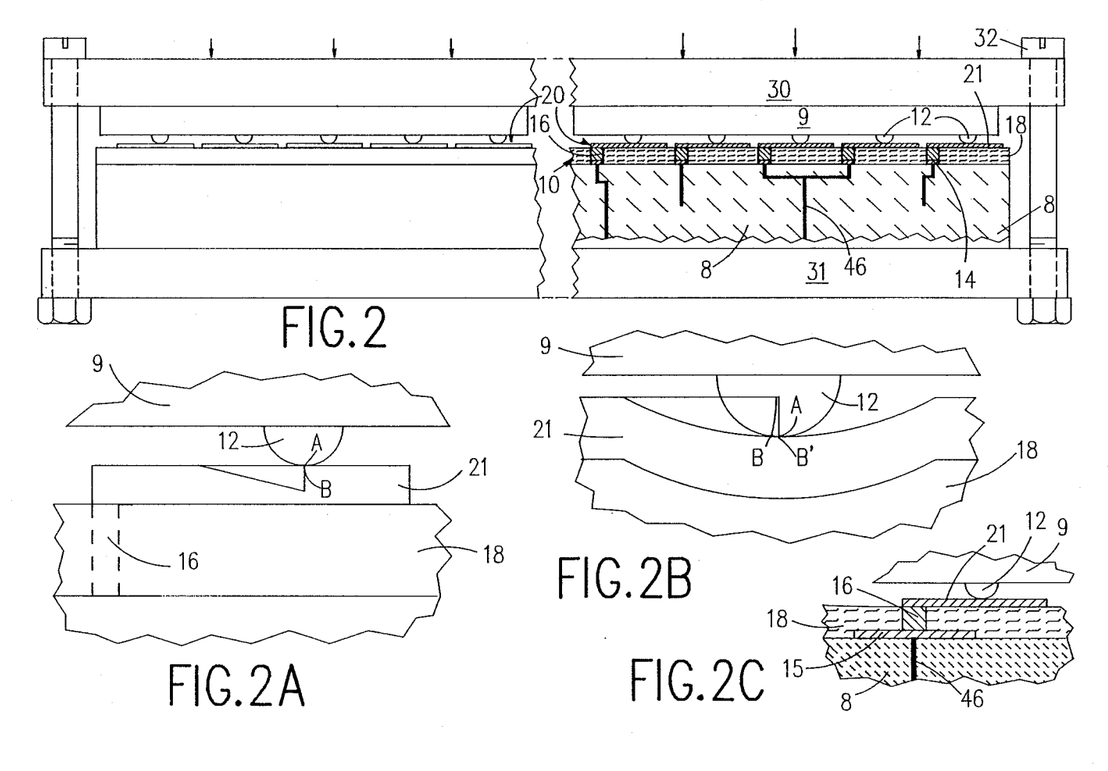
FIG. 2 is an elevational view of an integrated circuit chip connected to a substrate using the connector of the present invention.
FIG. 2A is a partial elevational view at the point of initial contact between chip I/O pads and the connector.
FIG. 2B is a partial elevational view of the point of contact between chip I/O pads and the connector after connection to demonstrate wipe.
FIG. 2C is a partial elevational view demonstrating an alternative structure including capture pads.

FIGS. 1 and 2 illustrate the elastomeric connectors of the present invention. Referring to FIG. 1, an elastomeric connector 10 for forming an area array of surface connections between a VLSI chip 9 and a substrate (e.g. multilayered ceramic substrate) 8 is described. The trend in high density VLSI packaging of integrated circuit chips is toward high density area arrays of input-/output (I/O) pads on the chips and corresponding pads on the multichip substrate which they are mounted on. Metallized pads 12 provide the I/O connections to the circuitry of VLSI chip 9. Electronic package 8 is a higher level of packaging than package 9, and would preferably be a multilayered ceramic substrate, even though those skilled in the art will realize that multilayered polymer packages and the like may be utilized as well.

The present invention is based on an elastomer system having metal through-hole conductors 16 embedded in an elastomeric base 18. The elastomeric base 18 is typically a low compression set elastomer material chosen so that a preselected force which will not damage the chip (e.g., less than approximately 180 lbs./in$^2$) will cause approximately a 25-50 percent deformation of the elastomer beneath the surface conductor tabs 20 which comprise the contact area with the I/O of the chips. A preferred example is a porous polyurethane polymer. The elastomeric base may be most any elastomer that functions to deform and provide a requisite reactionary force for contacting the I/O pads of a chip within the structural confines of the connector of this invention without requiring a large force that could damage the chips or any other components of the VLSI system.

The through-hole conductors 16 are typically comprised of a metallic material having a high electrical conductivity, preferably solid copper, gold or a copper-/aluminum alloy. The through-hole conductors provide a direct electrically conductive path through the elastomer base 18 between I/O pads 12 on the chips 9 and I/O pads 14, on the substrate. Preferably, the through-hole conductor makes direct contact with the I/O pads 14 of substrate 9, and the overhanging contact regions 21 provide easy alignment and wipe with the I/O pads 12 of the chips.

As best shown in FIGS. 1 and 2, surface conductor tabs 20 exist on the top surface of the elastomer base 18, and are connected to each of the through-hole conductors 16 at that surface. The surface conductor tabs 20 are located on the surface opposite of the surface where the through-hole conductors 16 make direct contact with I/O pads 14 of the substrate metal lines 46, make contact with I/O pads. The surface conductor tabs 20 are typically made of the same metal as the through-hole conductors 16, e.g., solid copper, gold, copper-aluminum alloy. A thin layer of gold is preferably provided on the top surface of each surface conductor tab 20 to provide enhanced contactability. The surface conductor tabs 20 each have an overhanging contact region 21 which extends past the periphery of the through-hole conductors 16. The overhanging contact regions 21 preferably occupy as much of the surface area of the elastomeric base as possible so that a high density of contacts are provided for as well as easy alignment. The overhanging contact regions 21 preferably occupy at least 50 percent of the top surface of the elastomer connector. Various alternative geometries which occupy a large portion of the top surface exist, such as the alternative embodiment shown in FIG. 1A wherein overhanging contact region 21a has substantially four sides with rounded corners. The functionality due to the material and geometry as well as the cooperation of the subcomponents of the present connector system provide easy alignment, high contact density and automatic wipe for fragile semiconductor chips.

Referring to FIG. 1, the overhanging contact regions 21 are aligned with I/O pads 12 of chips 9. The I/O pads 12 are purposefully aligned with overhanging contact regions 21 of surface conductor tabs 20 to assure automatic wipe. Note that since the preferred connection of substrate I/O pads 14 is directly with through-hole conductors 16, it is evident that the corresponding I/O pads of substrate 8 and chips 9 are preferably slightly offset since overhanging contact regions 21 are offset with the conductor through-holes 16. The elastomeric connector of the present system provides automatic wipe which is most clearly depicted in FIGS. 2A and 2B (FIG. 2B is shown approximately twice as large as FIG. 2A in scale so that the wipe can be depicted as clearly as possible in schematic fashion). Referring to FIG. 2A, contacting chip I/O pads 12 onto overhanging contact region 21 where points A (at the tip of chip I/O 12) and B (corresponding to initial contact point of overhanging contact region 21) initially coincide causes a downward movement of overhanging contact region 21. As shown in FIG. 2B, because overhanging contact region 21 is not an elastic material and is not reduced in cross section upon contact, the point B' (at which point A of chip I/O 12 ultimately contacts overhanging contact region 21) is different from the point B where point A of chip I/O 12 initially contacts overhanging chip region 21. The resultant wipe is the distance between points B and B'. As alluded to above, the overhanging contact areas 21 also allow for simple alignment between the connector and I/O pads of the electrical components because there is a relatively large area onto which I/O pads 12 can make good electrical contact with overhanging contact region 21.

Having defined the general structure of the connector of the present invention, the preferred embodiments are now described. FIG. 2 depicts integrated circuit chips 9 each having an area array of metallized I/O contacts 12 (in state of the art VLSI applications this array is typically between a 5 by 5 matrix and a 30 by 30 matrix). The dimensions of the connector 10 typically match the length and width of the substrate (e.g. multilayered ceramic) 8. In order to achieve at least 1 mil of wipe when a force causing a 25 to 50 percent deformation of the elastomer is applied, the elastomer should be a minimum of approximately 5 mils thick. The total thickness of elastomeric connector 10 is preferably between 7 and 25 mils, while the corresponding elastomer base thickness is typically in the range of 5 to 20 mils. Through-hole conductors 16 are typically 2-5 mils on 4-10 mil centers, but may vary according to required I/O and current density and the limits of metal deposition by lithography, laser deposition means, etc. In state of the art VLSI applications, wherein the through-hole conductors 16 are approximately 4 to 6 mils in diameter on 8 to 12 mil centers, then the dimensions of the surface conductor tabs 20 are preferably approximately 5 mils square, starting from the center of each of the through-hole conductors 16. Those skilled in the art will realize that various diameters and center to center distances for through-hole conductors may be used, and that the upper limit on the dimensions of the surface conductor tabs is such that they do not short out adjacent through-hole conductors. The preferred thickness of the surface conductor tabs for chip to substrate or chip testing interconnections is in the range of 2–5 mils. For an elastomeric base thickness of 5 to 10 mils it is preferred that the surface conductor tabs be as close to 2 mils thick as possible since it will more readily bend and will be easier to deposit onto the elastomer. For permanent connections, the chips 9 are held in place on substrate 8 by purely mechanical means without the requirement for solder reflow steps, etc. It is preferred that the mechanical means be a flat heat conductive plate 30 that is biased toward chips 9 and urges chips 9 toward the elastomeric connector so that each chip I/O 12 contacts an overhanging contact region 21. In the preferred embodiment the biasing force is provided by a clamping means 32 in conjunction with a bottom metal plate 31. Those skilled in the art will appreciate that alternate means of biasing the chip I/O toward the connector are available.

The plate 30 has the added advantage of being able to function as a cold plate to facilitate the cooling of the VLSI chips 9, which are currently dissipating power as high as approximately 25–50 watts per 0.5 square cm. The connector 10 will provide planarity of chips because the solder reflow operations which contribute to chip tilt and height variations in solder ball type area array connection schemes are no longer required, and because the elastomer base 18 is resilient enough to compensate for slight planarity differences due to manufacturing tolerances. The planarity of the chips 9 makes the application of a flat cold plate for cooling most efficient primarily because the chip tilt and height variations associated with solder ball type connections of area array chips that have made flat contact unfeasible in the past are eliminated. The cold plate 30 may be solid metal (e.g. Al, Cu) connected to a body containing a coolant (not shown) which cools plate 30 by conduction, or the cold plate 30 may be metal machined to allow cooling fluid (not shown) to circulate through. If the thermal interface between the chips 9 and cold plates 30 there between is not planar in certain situations (e.g., wherein the connector is used in a product wherein the chips themselves are not flat, or the substrate surface is grossly non-planar, or the cold plate cannot be precisely machined), then cooling can be enhanced by providing a resilient heat conductive material such as the thermal interface element described in the IBM TDB to Dorler et al entitled, "Low Cost, High Performance Cooling Package", Vol. 26, No. 108, March 1984, pp. 5473-5474, or in U.S. Pat. No. 4,654,754 to Daszkowski, entitled "Thermal Link", which are hereby incorporated by reference.

An alternate embodiment may be used in some instances to improve the alignment of substrate I/O pads 14 and through-hole conductors 16. In the alternative embodiment as shown in FIG. 2C, which could typically be used if density and electrical requirements allow, substrate I/O pads 14 may be made into larger sized capture pads 15 to facilitate easier alignment. The capture pad 15, is connected to a metal line 46. A description of capture pad dimensions and deposition processes exists in co-pending U.S. Patent Application Ser. No. 167,290, filed on Mar. 11, 1988, entitled, "Sealing and Stress Relief Layers and Use Thereof", by Carr, et al, which is hereby incorporated by reference.

The elastomeric connectors 10 are capable of interconnecting a high density area array of corresponding I/O pads of electrical components. The metal through-hole conductors 16 running directly from the top surface of the elastomer base to the bottom and metal surface conductor tabs 20 are of high conductivity and short in length in the elastomeric connector. Thus, the corresponding electrical performance is enhanced as a result of the fact that current and signals can move directly from one side of the elastomer to the other through a very highly conductive system, minimizing signal travel times. This electrically efficient connector also facilitates chip cooling since the chip tilt and height difference problems associated with solder ball bonds are eliminated. Simple alignment, self wiping and solderless rework capability for VLSI chip interconnections are also provided. This electrical performance and short path results in a structure that is also very useful as a test probe for testing an integrated circuit chip.

Figure 3:
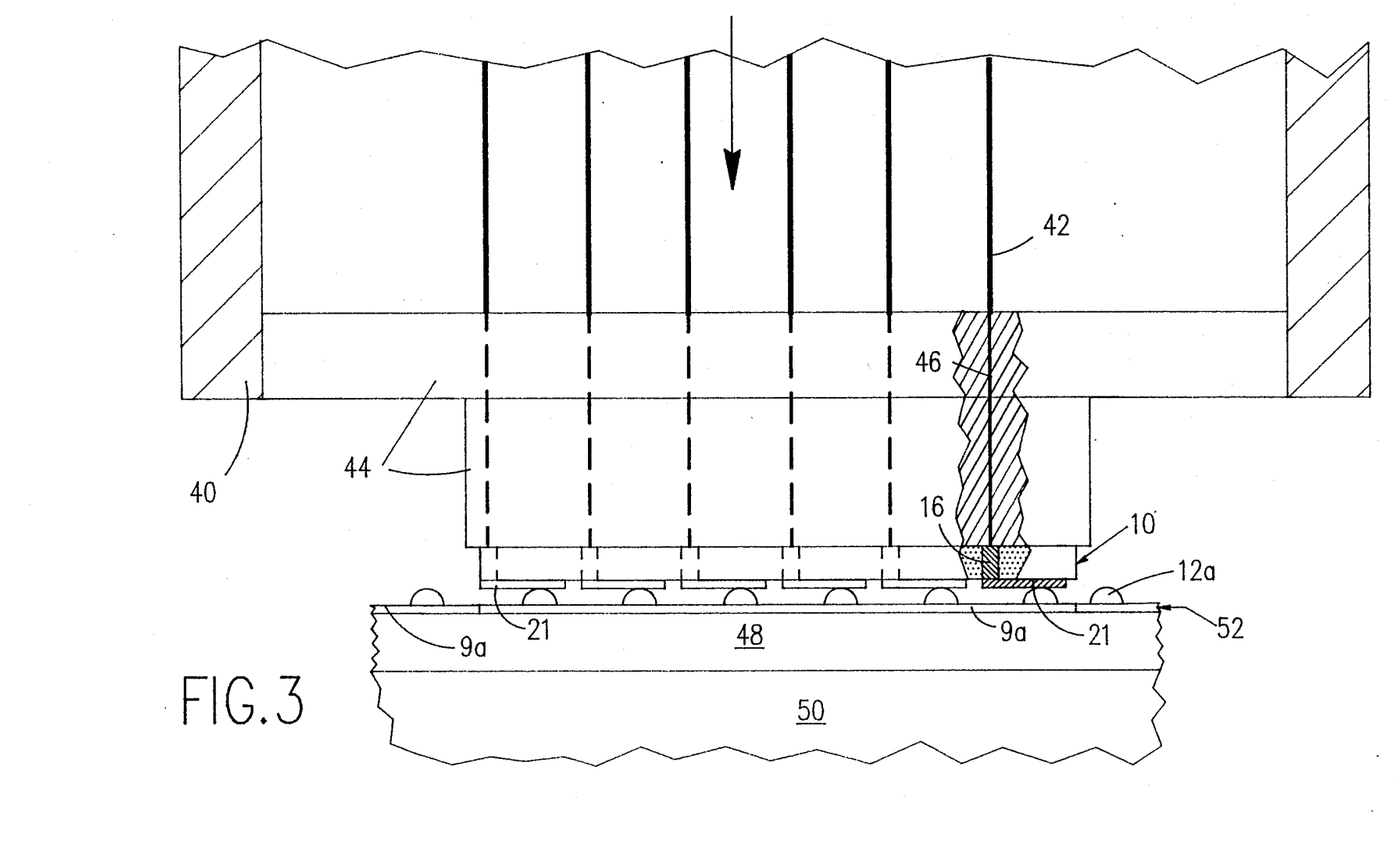
FIG. 3 is an elevational view of an embodiment of the present connector using the connector as a temporary probe to test undiced integrated circuit chips in a wafer.
Figures 4, 5:
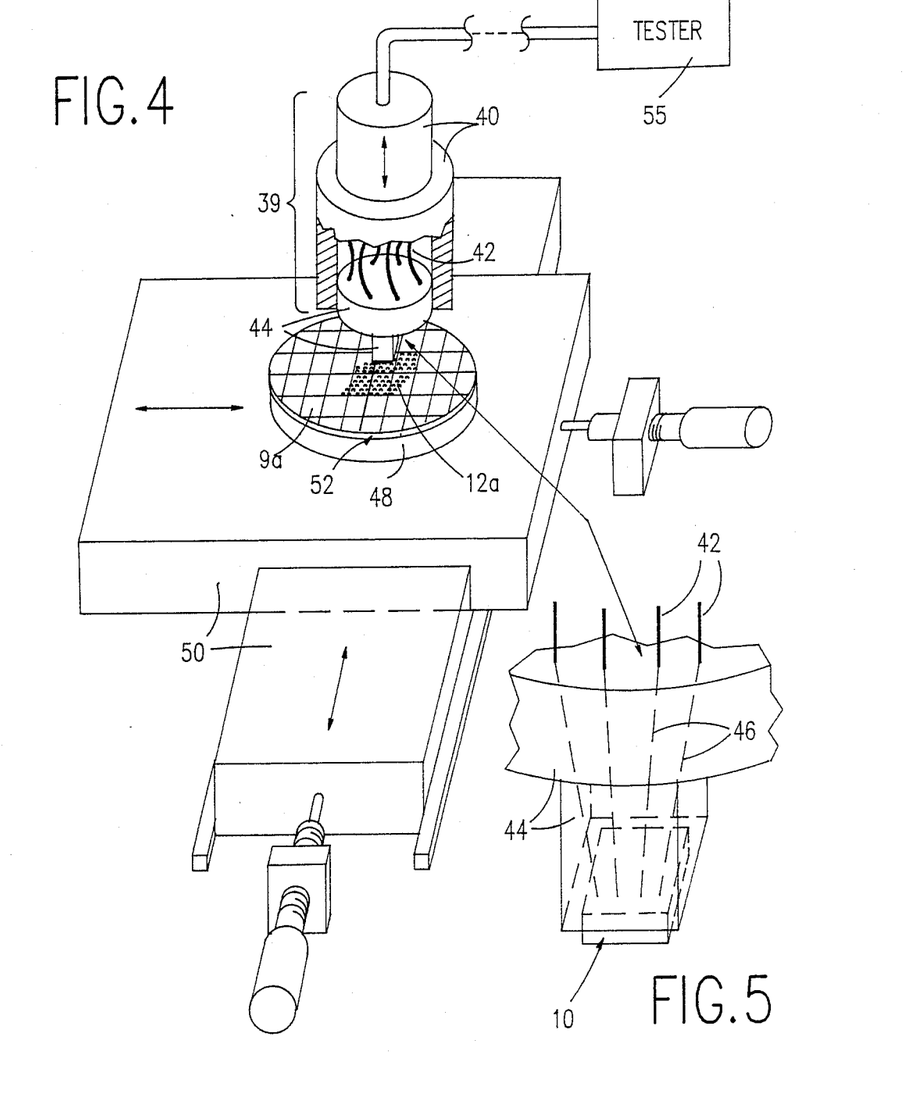
FIG. 4 is a schematic representation of a state of the art chip testing apparatus that may incorporate the elastomeric connector of the present invention.
FIG. 5 is an enlarged view of the space transformer and the elastomeric transformer as shown in FIG. 4.

A typical test probe made in accordance with the present invention is shown in FIGS. 3 and 4. Referring to FIG. 4, the elastomeric connector 10 used in a test probe 39 is preferably assembled as an integral part of a space transformer 44. The space transformer serves the purpose of spreading out a closely-spaced wiring grid into a more widely spaced wiring grid so that the required circuitry can perform its test operations. Incorporation of the connector 10 built in accordance with the present invention into test probe 39 is easily facilitated and test probe 39 is then mounted on a vertical (Z-direction) motion means 40. Referring to FIG. 3, the detailed assembly is such that the through-hole conductors 16 of the connector 10 contact metal lines 46 of the space transformer 44, which lead to connections 42 which lead to the required test circuitry. Elastomeric base 18, through hole conductors 16 and overhanging contact regions 21 are built in accordance with the specifications given for the elastomeric connector built onto the multilayered ceramic substrate as described above, while connections 42 carry the current and signals which are required to test the chips. A mechanical vertical motion means 40 is used to raise, lower and hold the test probe in position.

Operation

Refer to FIGS. 1 and 2 to follow the operation of the elastomeric connector 10 to provide permanent connections between chips and substrates. When the elastomeric connector 10 of the present invention is in its initial position as shown in FIG. 1, accurate alignment of a dense area array of I/O pads 12 with the connector surface conductor tabs 20 is accomplished as I/O pads 12 contact the relatively large overhanging conductive regions 21 of the surface conductor tabs. In the preferred form shown in FIG. 1, the connector 10 is built as an integral upper layer upon the top surface of substrate 8. The through-hole conductors 16 are easily aligned with substrate I/O pads 14 or capture pads 15 by state of the art processing wherein holes are created by lithographic or particle or laser beam processing and filled with solid metal conductors. In the preferred embodiment, wherein there are 4 mil through-holes 16 on 8 mil centers, the area of overhanging contact region 21 is approximately 22 square mils. The contact area of the chip I/O's is approximately 12 square mils (i.e. corresponding to a 4 mil diameter). Thus, in the preferred embodiment, each 12 square mil I/O pad 12 of chip 9 is aligned with and contacts a 22 square mil overhanging contact region 21. This result of a ratio of chip I/O pad area to overhanging contact region area of approximately 1 to 2 is a relatively simple task for state of the art positioning equipment.

Once the proper alignment is made, the electrical components are biased toward each other and retained together. The elastomeric base 18 then exerts a force such that each of the overhanging conductive regions 21 contact and wipe the corresponding I/O pads 12 of chips 9.

The chips are preferably biased towards the overhanging conductive regions and retained by flat plate 30, which is preferably a thermal conductor (e.g. metal). The biasing force applied by plate 30 onto chips 9, (e.g., force exerted by clamping means 32), is preferably enough to cause a 25-50 percent depression of the elastomer base 18 in the area beneath the interface of chip I/O 12 and overhanging contact region 21, yet not enough to cause any damage to the chip (e.g., less than approximately 180 lbs/square inch). Other biasing force criteria are that in a particular elastomer solid metal system, there is minimal compression to the surface conductor tabs 20 such that the cross-sectional area of each surface conductor tab remains constant, and that the elastomer is not punctured at any point. For a 5 mil elastomer of porous polyurethane, and a 2 mil thick copper surface conductor tab, a pressure in the range of approximately 12 to 50 lbs/square inch is preferred to provide the required force.

As best shown by FIGS. 2A and 2B, the automatic wiping between the overhanging contact regions 21 of the surface conductor tabs 20 and chip I/O pads 12 is accomplished by contacting chip I/O pads 12 onto overhanging contact region 21 where points A (at the tip of chip I/O 12) and B (corresponding to initial contact point of overhanging contact region 21) initially coincide, causing a downward movement of overhanging contact regions 21. As shown in FIG. 2B, because the overhanging contact regions 21 are not made of an elastic material and do not reduce in cross section upon contact the point B' (at which point A of chip I/O 12 ultimately contacts overhanging contact region 21) is different from the point B where point A of chip I/O 12 initially contacts overhanging chip region 21. The resultant wipe is the distance between points B and B'.

In the preferred embodiment having 4 mil through holes and a 22 square mil overhanging copper contact region 21 being approximately 2 mils thick and a porous polyurethane elastomer base of approximately 5 mils, a 50 percent deformation of the elastomer causes approximately 1 mil of wipe per chip I/O contact, which assures very reliable connections. The pressure required to achieve a 25-50 percent deformation is approximately 12-50 pounds per square inch in the above described system.

Due to the combination of connector configuration and materials utilized therein, flexible connections between electrical components are possible without exerting large engagement forces to achieve localized pressure at the contact points of the I/O pads of the electrical components. This is very critical when connecting fragile integrated circuit semiconductor chips to substrates. The flexible connections allow chips or other electrical components which must have heat dissipated therefrom to be planar with each other. The chips connected to substrates by this connector do not suffer from chip tilt or differences in chip height which is a major advantage over C-4 or solder ball type connections. Internal thermal enhancements which are typically utilized to dissipate heat from state of the art high powered area array VLSI chips operate at greatly reduced efficiency when chip tilt and chip height variations are present. The combination of improved thermal performance, which in turn reduces thermal stress, and reduced mechanical stresses on chips and other electrical components drastically reduces the overall stress experienced by the chips.

The ability to make high density interconnections of dense area arrays of I/O pads without exerting significant thermal or mechanical stresses on the I/O pads or components being interconnected is a major advance in the VLSI connector art. The ability to have automatic wiping of high density area arrays of interconnections is an added advantage that makes such a high density interconnection system practical. Without wiping; reliable, solderless connections cannot be achieved because surface films and debris must be penetrated to minimize contact resistance and assure metal to metal connections. The electrical advantages provided by the short inductive path and high conductivity that are provided for in combination with the other advantages afforded by the present invention allows for reliable interconnections that meet the high standards required for state of the art high end VLSI computer systems.

Another advantage of the present invention relates to its rework capability. The standard means of interconnecting chips to substrates currently comprise a bonding means such as soldering or welding, wherein reworking multi-chip modules causes many strategic problems. To either repair or rework electrical components interconnected by the elastomeric connector of the present invention, the means biasing electrical components toward each other must simply be disengaged at room temperature. This is possible because there are no bonding means such as solder incorporated into the present elastomeric interconnection system. By contrast, the presently employed rework methods for solder ball connections require a series of high temperature thermal treatments.

The operation of the present invention for making temporary connections as part of a test probe is shown in FIGS. 3 and 4.

Referring to FIG. 4, in a typical test probe 39 and associated process, an undiced wafer 52 having a plurality of defined chip cites 9a thereon is held in place on a chuck (generally a vacuum chuck) 48, which is mounted on a high precision X-Y table 50. To test a specific chip in the undiced wafer, the X-Y table moves the chip under the elastomeric connector 10 of test probe 39. As the test probe 39 is lowered towards the chip, the elastomeric connector 10 facilitates contact between the test probe and chip. Referring specifically to FIG. 3, as the elastomeric connector 10 comes into contact with the chips, the metallized contact pads 12a of the chip come into contact with overhanging contact regions 21. A vertical positioning means 40 is used to lower and hold the probe circuitry and elastomeric connector 10 in the required position. Enough pressure is applied by positioning means 40 such that approximately a 25-50% deformation of elastomer 18 under overhanging contact region 21 occurs. This pressure (less than approximately 180 lbs/square inch) will be chosen such that it causes the required deformation, yet does not cause any damage to the undiced chips in the wafer. In the present example wherein the elastomer is comprised of approximately 5 mils thickness of porous polyurethane and the surface conductor tabs are comprised of approximately 2 mils thickness of solid copper, the required pressure is between approximately 12 and 50 lbs per square inch. Connections 42 provide power and signals, and connect the test probe 10 through the space transformer 44 to the circuitry and equipment (i.e. tester 55) which performs the chip testing.

After testing of a particular chip location, the probe is raised, the X-Y table is moved to position another chip location, and the testing operation is repeated.

A preferred method for producing the elastomeric connector 10 of the present invention comprises applying elastomer base 18 to the top surface of electrical component 8 or space transformer 44. Through-holes are formed completely through the elastomer layer by laser drilling, E-beam processing, reactive ion etching, or photolithography means so that the resulting array of vias corresponds to the area array of I/O pads on one of the electrical components being connected (i.e., the multichip substrate or tester space transformer). Alternatively, if a pre-formed elastomer sheet is applied, through-holes may be applied to the pre-formed elastomer prior to joining the elastomer to the substrate or space transformer. Solid metal (e.g., copper, Cu/Al) through-hole conductors 16 are preferably deposited in the vias through a mask by vapor deposition or plating. The surface conductor tabs 20 are then preferably formed by vapor depositing metal onto the top surface of the elastomer through a second mask, or by electroless plating. The surface conductor tabs 20 are formed so as to substantially cover and connect to the uppermost exposed surface of the through-hole conductors 16 and to simultaneously form overhanging contact regions 21. A thin layer of non-oxidizing metal, (e.g., gold) is preferably evaporated over the surface conductor tabs. In addition to the factors mentioned above, the specific elastomer and metals chosen will also depend on factors such as adhesion between the elastomer and metal conductors. Additional steps may be required for enhancing adhesion such as depositing thin layers of adhesion promoting materials such as Cr or Ni or Pd or a combination thereof on the elastomer, and/or metal.

While the invention has been particularly shown and described with reference to the preferred embodiments thereof, it will be understood by those skilled in the art that various changes in form and details may be made therein without departing from the spirit and scope of this invention.

What is claimed is:

1. An elastomeric connector for connecting at least one input/output pad of a first electrical component located on the first surface of said elastomeric connector to at least one corresponding input/output pad of a second electrical component located on the second surface of said elastomeric connector comprising:
   an elastomeric base,
   at least one substantially linear through-hole conductor extending from said first surface of said elastomeric base to said second surface,
   at least one surface conductor tab located on said first surface of said elastomeric base, said surface conductor tab being connected to said substantially linear through-hole conductor at said first surface of said elastomeric base, said surface conductor tab having an overhanging contact region extending past the periphery of said through-hole conductor,
   said substantially linear through-hole conductor remains stationary while said first electrical component is urged against said overhanging contact region,
   said overhanging contact region being substantially parallel to said first surface of said elastomeric base is aligned with input/output pad of said first electrical component mounted on said first surface of said elastomeric connector; and
   said substantially linear through-hole conductor at said second surface of said elastomeric base being aligned with said input/output pad of said second electrical component located on said second surface of said elastomeric base to make direct surface engagement therewith.

2. The elastomeric connector of claim 1 wherein said elastomeric base is an integral part of said substrate.

3. The elastomeric connector of claim 1 wherein said input/output pads are arranged in an area array.

4. The elastomeric connector of claim 2 wherein said input/output pads are arranged in an area array.

5. The elastomeric connector of claim 1 wherein said elastomeric base is a material that will deform 25 to 50 percent in thickness upon the application of a pressure of less than 180 lbs/square inch.

6. The elastomeric connector of claim 3 wherein said elastomeric base is a polyurethane polymer.

7. The elastomeric connector of claim 4 wherein said elastomeric base is a porous polyurethane polymer.

8. The elastomer connector of claim 2 wherein said elastomeric base is a material that will deform 25 to 50 percent in thickness upon the application of a pressure of less than 180 lbs/square inch.

9. The elastomeric connector of claim 1 wherein said electrical components located on said first surface of said elastomeric connector are semiconductor chips.

10. The elastomeric connector of claim 3 wherein said electrical components located on said first surface of said elastomeric connector are semiconductor chips.

11. The elastomeric connector of claim 1 wherein said substrate is a multilayered ceramic substrate.

12. The elastomeric connector of claim 2 wherein said substrate is a multilayered ceramic substrate.

13. The elastomeric connector of claim 3 wherein said substrate is a multilayered ceramic substrate.

14. The elastomeric connector of claim 1 wherein said through-hole conductor are comprised of metal.

15. The elastomeric connector of claim 14 wherein said surface conductor tabs are comprised of metal.

16. The elastomeric connector of claim 1 wherein the thickness of said elastomeric base is at least approximately 5 mils.

17. The elastomeric connector of claim 16 wherein the thickness of said surface conductor tabs is in the range of approximately 2 mils to approximately 5 mils.

18. The elastomeric connector of claim 1 wherein said second electrical component is a space transformer of a chip test probe.

19. The elastomeric connector of claim 2 wherein said second electrical component is a space transformer of a chip test probe.

20. The elastomeric connector of claim 3 wherein said second electrical component is a space transformer of a chip test probe.

21. The elastomeric connector of claim 14 wherein said second electrical component is a space transformer of a chip test probe.

22. The elastomeric connector of claim 17 wherein said second electrical component of a chip test probe.

23. The elastomeric connector of claim 1 wherein a non-oxidizing metal exists on the surface of said overhanging contact regions.

24. The elastomeric connector of claim 28 wherein said means for mechanically retaining comprises a flat plate which contacts and exerts a biasing force on said electrical components in the direction of said substrate.

25. The elastomeric connector of claim 24 wherein said flat plate is thermally conductive.

26. The elastomeric connector of claim 1 wherein means for mechanically retaining said electrical components are provided so that at least one said input/output pad of at least one said electrical component contacts said overhanging contact region of said elastomeric connector.

27. The elastomeric connector of claim 1 wherein said elastomeric base exerts a force so that said overhanging contact region each contact and wipe said corresponding input/output pad of said electric component.

28. The elastomeric connector of claim 1 wherein said input/output pad of said second electrical component has an overhanging contact region extending past the periphery of said through-hole conductor.

* * * * *